(12) United States Patent
Kano

(10) Patent No.: US 7,354,647 B2
(45) Date of Patent: Apr. 8, 2008

(54) ORGANIC BISTABLE ELEMENT, ORGANIC BISTABLE MEMORY DEVICE USING THE SAME, AND METHOD FOR DRIVING SAID ORGANIC BISTABLE ELEMENT AND ORGANIC BISTABLE MEMORY DEVICE

(75) Inventor: Masataka Kano, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/803,539

(22) Filed: Mar. 18, 2004

(65) Prior Publication Data

US 2004/0240261 A1 Dec. 2, 2004

(30) Foreign Application Priority Data

Mar. 19, 2003 (JP) .............................. 2003-074987

(51) Int. Cl.
*B32B 9/00* (2006.01)
*H01L 51/00* (2006.01)

(52) U.S. Cl. ...................................... 428/411.1; 257/40
(58) Field of Classification Search ............. 428/411.1, 428/457; 257/40; 365/158
See application file for complete search history.

(56) References Cited

U.S. PATENT DOCUMENTS

2004/0246770 A1* 12/2004 Kano ......................... 365/154

FOREIGN PATENT DOCUMENTS

WO    WO 0237500 A1 *  5/2002

* cited by examiner

*Primary Examiner*—Ramsey Zacharia
(74) *Attorney, Agent, or Firm*—Harness, Dickey & Pierce, P.L.C.

(57) ABSTRACT

There are provided an organic bistable element, which is simple in structure, can eliminate the need to increase production process steps, and has a low switching voltage, a memory device using the same, and a method for driving the organic bistable element and the memory device. The organic bistable element has a laminate structure comprising an organic thin film interposed between a first electrode and a second electrode. The organic thin film comprises an organic compound represented by formula (I):

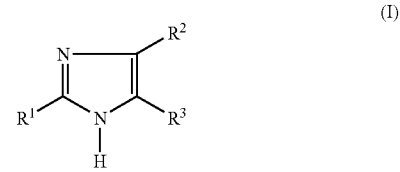

2 Claims, 7 Drawing Sheets

ORGANIC BISTABLE ELEMENT, ORGANIC BISTABLE MEMORY DEVICE USING THE SAME, AND METHOD FOR DRIVING SAID ORGANIC BISTABLE ELEMENT AND ORGANIC BISTABLE MEMORY DEVICE

BACKGROUND OF THE INVENTION

1. Field of the Invention

The present invention relates to an organic bistable element, which has a relatively simple structure and can be operated at a low drive voltage, a memory device using the same, and a method for driving the organic bistable element and the memory device.

2. Background Art

A conventional organic bistable element has a laminate structure in which a ferroelectric layer is interposed between a pair of electrodes. For example, anthracene and TTF-CA (an alternately laminated charge transfer complex of tetrathiafulvalene and tetrachloro-p-benzoquinone) have been studied for use as compounds for constituting the ferroelectric layer (see, for example, Japanese Patent Laid-Open No. 345431/2001 on pages 2 and 3, FIG. 1).

Further, an organic bistable element has also been proposed in which a laminate having a three-layer structure comprising an electrically conductive thin film interposed between two layers of low-electrically conductive organic thin film having a two-layer structure is used instead of the ferroelectric layer and is interposed between a pair of electrodes. In this case, AIDCN (2-amino-4,5-dicyanoimidazole) is used as the material for constituting the low-electrically conductive organic thin film (see, for example, pamphlet of WO 02/37500 on pages 6 to 8, FIG. 2).

The organic bistable element disclosed in Japanese Patent Laid-Open No. 345431/2001 suffers from a problem that, due to a relatively high switching voltage, power consumption in driving is increased. On the other hand, the organic bistable element disclosed in the pamphlet of WO 02/37500 is advantageous in that, as compared with the construction in which only the ferroelectric layer is interposed between the electrodes, the switching voltage can be reduced. However, due to the three-layer structure of the laminate sandwitched between the pair of electrodes, the organic bistable element disadvantageously has a complicated structure which involves the necessity of increasing production process steps.

In general, a protective resistor is provided to prevent the flow of an excessively large current in an organic bistable element in driving the element. The provision of this protective resistor, however, poses a problem that, since the protective resistor limits current which flows across both electrodes of positive bias and negative bias, malfunction of the element likely to occur.

SUMMARY OF THE INVENTION

The present inventor has now found that the application of AIDCN, which is a material for constituting a low-electrically conductive organic thin film used in a laminate having a three-layer structure, to a single-layer structure for the formation of a laminate structure comprising this single-layer structure sandwiched between a pair of electrodes is advantageous in that an organic bistable element, which has a simple structure, does not require an increase in production process steps, and has a low switching voltage, can be realized, and in that, in driving the element thus obtained, current, which flows in either a positive bias side or a negative bias side, can be limited to a given value. The present invention has been made based on such finding. Accordingly, an object of the present invention is to provide an organic bistable element, which has a simple structure, does not require an increase in production process steps, and has a low switching voltage, a memory device using the same, and a method for driving the organic bistable element and the memory device.

According to one aspect of the present invention, there is provided an organic bistable element having a laminate structure comprising an organic thin film interposed between a first electrode and a second electrode, said organic thin film comprising an organic compound represented by formula (I):

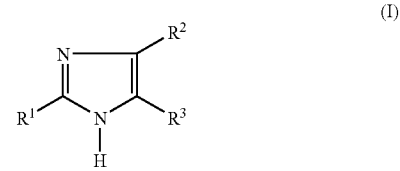

wherein, in $R^1$, $R^2$, and $R^3$, one or two of them each independently represent an electron-donating group selected from the group consisting of —H, —$NH_2$, —NHR, —$NR_2$, —SR, —X, —$CX_3$, —OH, —$OCH_3$, —OR and —R, wherein R represents a straight chain or branched chain alkyl group having 1 to 24 carbon atoms in which one or at least two methylene groups in the alkyl group are optionally substituted by a substituent of —O—, —S—, —CO—, —CHW—, wherein W represents —F, —Cl, —Br, —I, —CN or —$CF_3$, —CH=CH—, or —C≡C—, provided that a plurality of said substituents are not adjacent to each other, and X represents —F, —Cl, —Br, or —I; and the remaining group or groups of $R^1$, $R^2$, and $R^3$ each independently represent an electron-receiving group selected from the group consisting of —CN, —$NO_2$, —COR, —COOH, —COOR, and —$SO_3H$.

In a preferred embodiment of the present invention, the laminate structure further comprises a substrate, and either the first electrode or the second electrode is stacked in contact with the top of the substrate.

According to another aspect of the present invention, there is provided an organic bistable memory device comprising the above organic bistable element. In a preferred embodiment of the present invention, the organic bistable memory device further comprises a limiter for limiting, in writing information into the organic bistable element, current, which flows in either a positive bias side or a negative bias side, to a given value.

According to a further aspect of the present invention, there is provided a method for driving the above organic bistable element, said method comprising the step of limiting, in writing information into the organic bistable element, current, which flows in either a positive bias side or a negative bias side, to prevent a predetermined level or more of current from flowing in the organic bistable element.

According to the present invention, an organic bistable element with a simple structure and having a low switching voltage can be realized by adopting a structure comprising an organic thin film interposed between a pair of electrodes and using a predetermined imidazole compound as a material for the organic thin film.

Further, according to the present invention, since current, which flows in either a positive bias side or a negative bias side at the time of information writing, is limited to prevent a predetermined level or more of current from flowing in the organic bistable element, an organic bistable memory device, which is less likely to cause malfunction, can be realized.

DETAILED DESCRIPTION OF THE INVENTION

The organic bistable element according to the present invention, the memory device using the element, and the method for driving them will be described with reference to the accompanying drawings.

Figure 1:
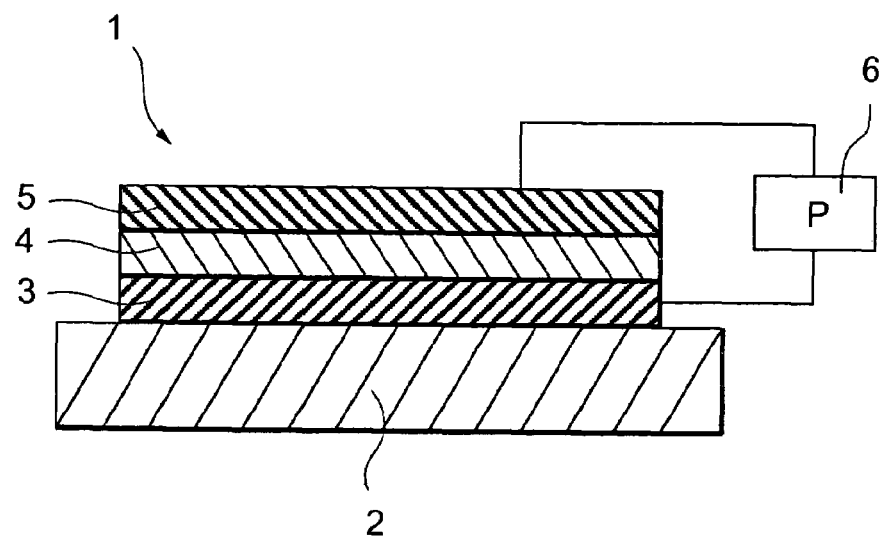
FIG. 1 is a schematic cross-sectional view showing one embodiment of a basic laminate structure of the organic bistable element according to the present invention.

FIG. 1 is a schematic cross-sectional view showing one embodiment of a basic laminate structure of the organic bistable element according to the present invention. An organic bistable element 1 according to the present invention has a laminate structure in which a first electrode 3, an organic thin film 4, and a second electrode 5 are stacked in that order on a substrate 2. Electric signal impressing means 6 is provided for impressing an electric signal between the first electrode and the second electrode. Here a part from the electric signal impressing means 6 to the first electrode 3 and a part from the electric signal impressing means 6 to the second electrode are in electrical continuity.

The substrate 2 is used for stacking thereon a first electrode 3, an organic thin film 4, and a second electrode 5 in that order. The substrate 2 is formed of an inorganic base material such as glass, silicon, or quartz or the following organic base material. The substrate 2 is used for supporting the layers provided thereon and may be omitted. When the substrate 2 is used, however, the handleability of the organic bistable element is improved because rigidity can be imparted to the organic bistable element. Further, the provision of the substrate facilitates the arrangement of a large number of the elements on the substrate to form a memory device or the like.

Organic base materials usable herein include polyamides, polyacetals, polybutylene terephthalate, polyethylene terephthalate, polyethylene naphthalate, syndiotactic polystyrene, polyphenylene sulfide, polyetherether ketone, liquid crystal polymers, fluororesins, polyether nitrile, polycarbonate, modified polyphenylene ether, polycyclohexene, polynorbornene resins, polysulfone, polyether sulfone, polyarylate, polyamideimide, polyetherimide, and thermoplastic polyimides. The organic base material, however, is not limited to these materials, and conventional plastics may also be used. In particular, when the substrate 2 is formed of an organic base material, the use of a thin flexible film having a thickness of about 5 to 300 µm can provide a flexible organic bistable element.

The first electrode 3 is preferably formed of, for example, a metallic thin film, a relatively high electrically conductive organic thin film, or a thin film of electrically conductive perovskite oxide from the viewpoint of providing proper bonding to the organic thin film 4 as a bistable layer. The metallic thin film may be formed of, for example, a highly electrically conductive metal such as Al (aluminum), Pt (platinum), Au (gold), Ag (silver), Fe (iron), Ni (nickel), Cr (chromium), Cu (copper), Ti (titanium), Hf (hafnium), Zn (zinc), Zr (zirconium), Mo (molybdenum), or Ta (tantalum). The highly electrically conductive organic thin film may be formed of, for example, PEDOT (3,4-polyethylenedioxythiophenylene/polystyrene sulfate), or properly doped polyaniline, polyacetylene, fullerene, carbon nanotube or carbon nanowire. The electrode may also be formed of a thin film of electrically conductive perovskite oxide. Suitable electrically conductive perovskite oxides include IrOx, MnOx, NiOx, CuOx, or RuOx or properly doped product of the above oxides. The thickness of the first electrode 3 is preferably about 0.5 nm to 5 µm although the thickness varies depending upon the electrical conductivity of the material.

The organic thin film 4 as a memory layer comprises an organic compound represented by formula (I). The organic compound is an organic compound containing at least one electron-donating group and at least one electron-receiving group. Electron-donating groups include —H, —NH$_2$, —NHR, —NR$_2$, —SR, —X, —CX$_3$, —OH, —OCH$_3$, —OR or —R. Here R represents a straight chain or branched chain alkyl group having 1 to 24 carbon atoms in which one or at least two methylene groups in the alkyl group are optionally substituted by a substituent of —O—, —S—, —CO—, —CHW—, wherein W represents —F, —Cl, —Br, —I, —CN or —CF$_3$, —CH=CH—, or —C≡C—, provided that these substituents are not adjacent to each other. X represents —F, —Cl, —Br, or —I. On the other hand, electron-receiving groups include —CN, —NO$_2$, —COR, —COOH, —COOR, and —SO$_3$H.

The organic thin film 4 may be formed by a gas phase method such as a vacuum deposition method using the above organic compound, or by a coating method such as spin coating using a solution prepared by dissolving an organic compound in a suitable solvent. The thickness of the organic thin film 4 is suitably 5 to 1000 nm.

As with the first electrode 3, the second electrode 5 is formed of a metallic thin film, a relatively high electrically conductive organic thin film, a thin film of an electrically conductive perovskite oxide or the like. The thickness of the second electrode 5 may be the same as that of the first electrode 3.

The organic bistable element according to the present invention is suitable for use in a memory device. When the organic bistable element is used as a memory, whether the organic bistable element 1 is in ON state or in OFF state can be judged by applying a positive or negative pulse voltage to the organic bistable element for a very short period of time to bring the state to writing (ON state) or erasing (OFF state) and then applying a constant voltage, which is a voltage smaller than the absolute value of the pulse voltage for writing or erasing, for a very short period of time. The characteristics of the element can be examined by applying a positive or negative voltage across the first electrode 3 and the second electrode 5 to measure current which flows across both the electrodes, or allowing a positive or negative current to flow across both the electrodes to measure voltage across both the electrodes.

In the present invention, in writing information in the organic bistable element, current, which flows in either a positive bias side or a negative bias side, is limited to prevent a predetermined level or more of current from flowing in the organic bistable element. Preventing a given level or more of current from flowing in the organic bistable element ensures reliable ON/OFF switching and thus can realize a memory device which is less likely to cause malfunction. The current on the positive bias side or negative bias side can be limited by regulating the current with a measuring device or by using a constant-current diode to prevent a predetermined level or more of current from flowing in the organic bistable element.

Figure 2:
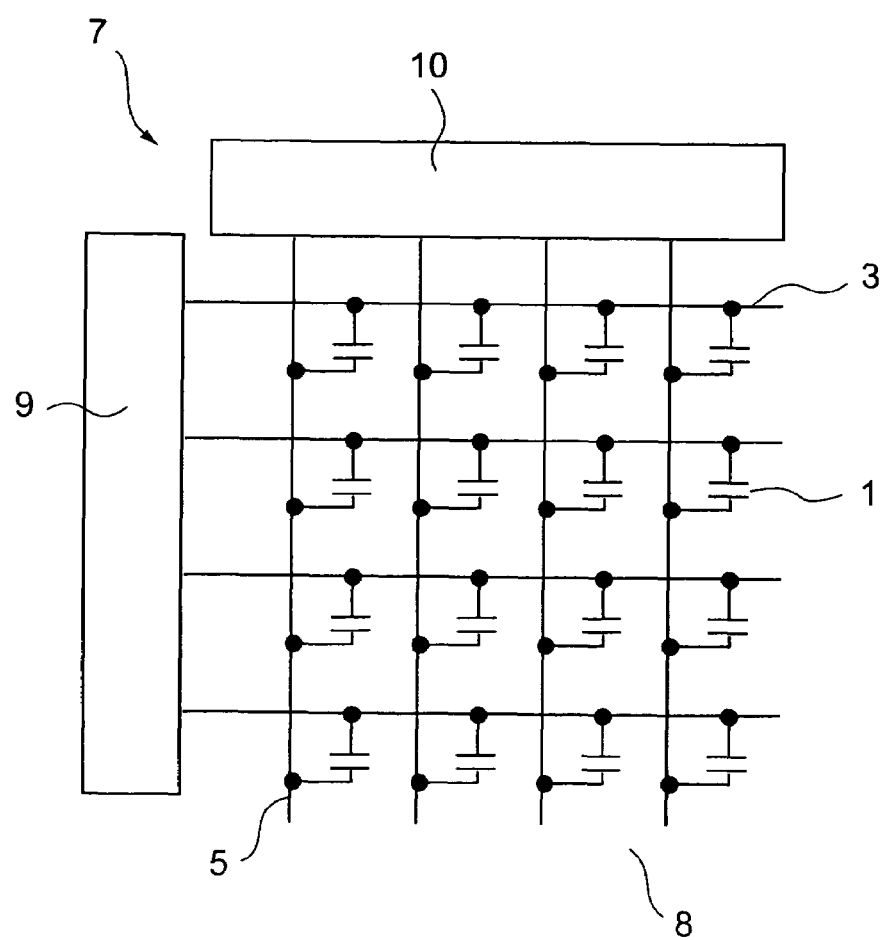
FIG. 2 is a typical diagram of an organic bistable memory device in which organic bistable elements according to the present invention are disposed in a simple matrix form.
Figure 3:
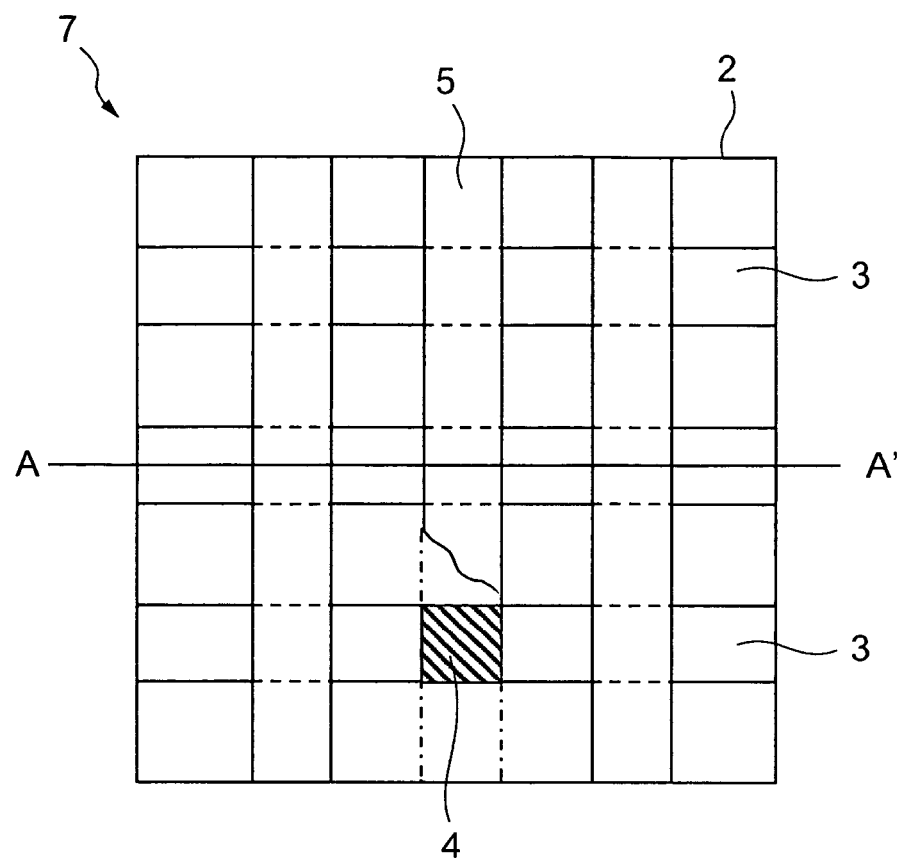
FIG. 3 is a plan view showing a memory cell array of the organic bistable memory device shown in FIG. 2.

The organic bistable element according to the present invention can be used to prepare an organic bistable memory device as shown in FIG. 2 (a typical view). FIG. 3 is a partially enlarged plan view of a memory cell array of an organic bistable element shown in FIG. 2, and FIG. 4 is a cross-sectional view taken on line A-A' of FIG. 3.

As shown in FIG. 2, the organic bistable memory device 7 includes a memory cell array 8 comprising organic bistable elements 1 arranged in a simple matrix form, an electrode for selective information writing in the organic bistable element 1 or selective information reading from the organic bistable element 1, and various circuits which include, for example, a first electrode 3, a first drive circuit 9 for selectively controlling the first electrode 3, a second electrode 5, a second drive circuit 10 for selectively controlling the second electrode 5, and a signal detection circuit (not shown).

The memory cell array 8 includes first electrodes (word lines) 3 for line selection and second electrodes (bit lines) 5 for row selection arranged orthogonally to the first electrodes 3. Specifically, the first electrodes 3 are arranged at a predetermined pitch in direction X, and the second electrodes 5 are arranged at a predetermined pitch in direction Y orthogonal to direction X. The signal electrodes may be reversed. That is, the first electrodes may be bit lines while the second electrodes are word lines.

Figure 4:
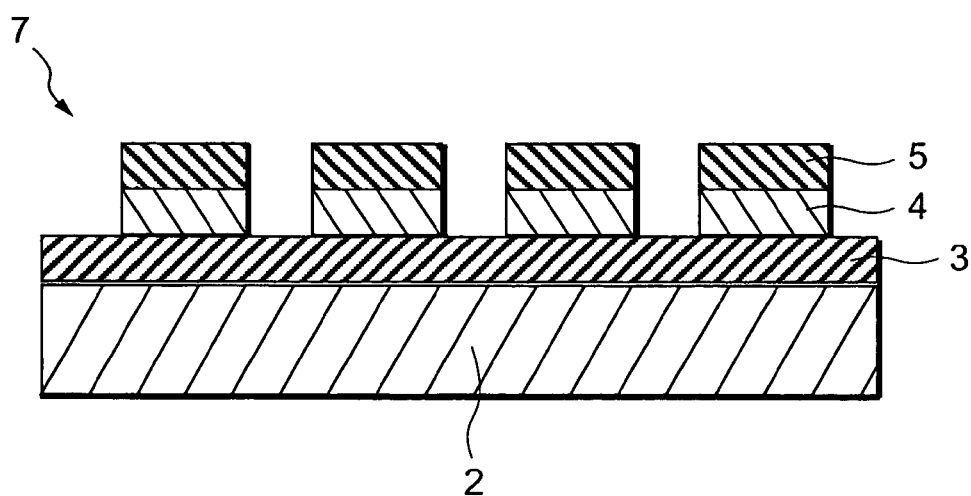
FIG. 4 is a cross-sectional view taken on line A-A' of the memory cell array shown in FIG. 3.

More specifically, in the organic bistable memory device 7, as shown in FIGS. 3 and 4, the first electrodes 3 are arranged on the substrate 2 so that the horizontal direction in the drawing is the longitudinal direction of the first electrodes 3, and the second electrodes 5 are arranged on the substrate 2 so that the vertical direction in the drawing is the longitudinal direction of the second electrodes 5. In the intersecting area of the first electrode and the second electrode, an organic thin film 4 (particularly indicated by a hatch) is stacked between the first electrode and the second electrode (The lower part of the second electrode 5 located in the center of FIG. 3 is not shown).

Figure 5:
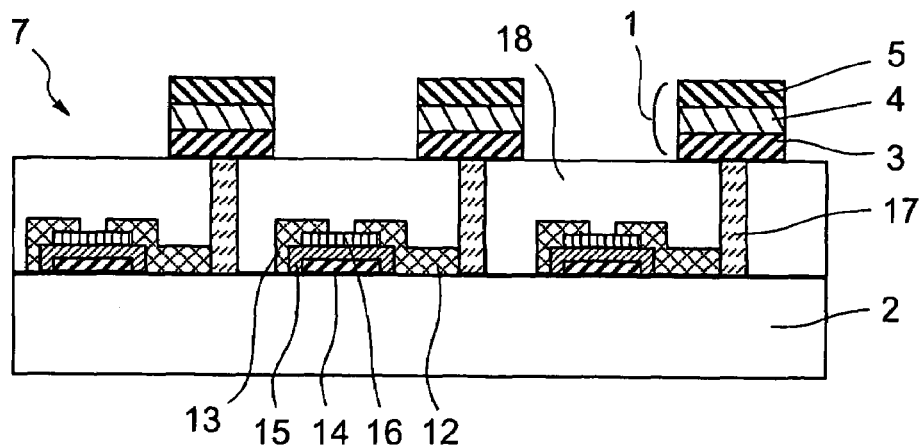
FIG. 5 is a typical cross-sectional view of an organic bistable memory device comprising the organic bistable element according to the present invention in combination with a thin-film transistor.

The organic bistable element according to the present invention is also suitable for use in an organic bistable memory device as shown in FIG. 5. FIG. 5 is a typical cross-sectional view of an organic bistable memory device 10 using the organic bistable element according to the present invention. This organic bistable memory device 10 has a transistor forming area for controlling the organic bistable memory device.

The transistor constituting the transistor forming area may have a conventional construction, and a thin-film transistor (TFT) or MOSFET may be used. In the embodiment shown in the drawing, TFT is used, and the transistor includes a drain electrode 12, a source electrode 13, a gate electrode 14, a gate insulating film 15, and an active layer 16. An extraction electrode 17 is connected to any one (the drain electrode 12 in the drawing) of the drain electrode 12 and the source electrode 13. The extraction electrode 17 is connected to the first electrode 3 in the organic bistable element 1 according to the present invention comprising the first electrode 3, the organic thin film 4, and the second electrode 5 stacked in that order as viewed from the bottom of the element. An interlayer insulating film 18 is provided on the substrate 2 with the transistor and the like formed thereon except for the extraction electrode 17 part. The organic bistable element 1 according to the present invention is provided on the above-described transistor forming area.

As described above, the organic bistable element according to the present invention is usable, by utilizing its characteristics, for an organic bistable memory device, which can electrically write, read, and erase information, and for other applications.

EXAMPLES

An organic bistable element shown in FIG. 1 was prepared according to the following procedure. At the outset, a clean glass substrate was provided. A 100 nm-thick thin film of aluminum was formed as a lower electrode (a first electrode) on the substrate at a deposition rate of about 0.3 nm/sec by means of a vacuum evaporation apparatus (stock number: VPC-410, manufactured by Shinku Kiko Co., Ltd). In the same manner as described above, a 40 nm-thick organic thin film of 2-amino-4,5-dicyanoimidazole (manufactured by Tokyo Chemical Industry Co., Ltd.) was formed by the vacuum evaporation apparatus on the thin aluminum film at a deposition rate of about 0.03 nm/sec. Finally, in the same manner as described above, a 40 nm-thick thin film of aluminum was formed as an upper electrode (a second electrode) by a vacuum evaporation apparatus at a deposition rate of about 0.1 nm/sec.

In forming the lower electrode, the organic thin film, and the upper electrode, the degree of vacuum within the chamber of the vacuum evaporation apparatus was kept at about $3 \times 10^{-6}$ Torr. In the formation of the aluminum film, the target substrate was kept at room temperature, and, in the formation of the organic thin film, the target substrate was kept at 50 to 60° C. Both the thickness of the deposited films and the deposition rate were regulated with a quartz-type film thickness meter (stock number: CRTM 6000, manufactured by ULVAC, Inc.).

Figure 6:
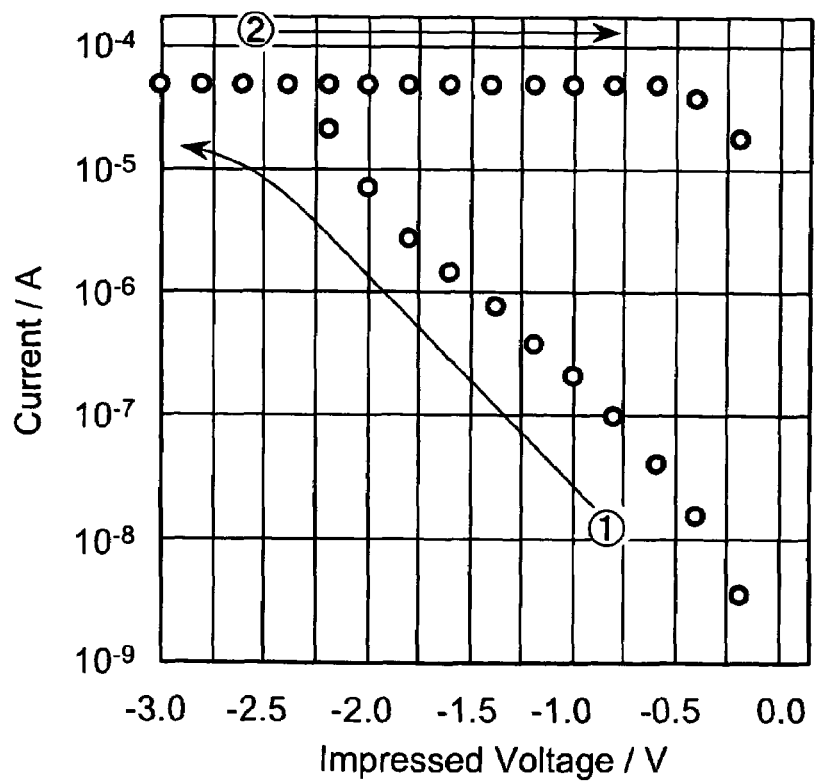
FIG. 6 is a graph showing characteristics obtained by applying a negative voltage to the organic bistable element according to the present invention.
Figure 7:
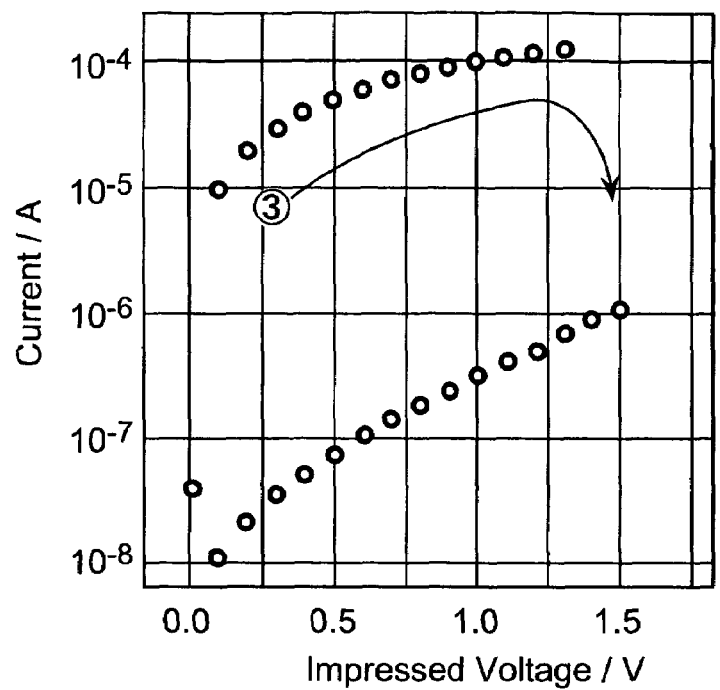
FIG. 7 is a graph showing characteristics obtained by applying a positive voltage to the organic bistable element according to the present invention.

Voltage was applied across both the electrodes of the organic bistable element prepared above, and the current flow across both the electrodes was measured with an ammeter (stock number: 237, manufactured by Keithley Instruments, Inc., U.S.A.; this ammeter serves both as a current-voltage meter and a direct-current power source). The results of measurement are shown in FIGS. 6 and 7. The current values are absolute values of the measured current values.

As shown in FIG. 6, voltage was applied, and the potential of the first electrode was decreased from 0 V. As a result, the current value gradually increased, reached the maximum value at a voltage of about −2 V, and then remained constant as the voltage was decreased to −3 V (as indicated by an arrow 1 in the drawing). This indicates that the organic bistable element was switched (converted) from a high-resistance state (an OFF state) to a low-resistance state (an ON state). When the state of the element before the application of the voltage is presumed to be a state having information of "0," the switching from the high-resistance state (an OFF state) to the low-resistance state indicates that electrical writing of information of "1" was carried out.

Thereafter, scanning was carried out so that the voltage was evenly increased from −3 V to 0 V. As a result, it was found that the measured current value remained at the current value after conversion to the low-resistance state until just before the voltage reached 0 V (as indicated by an arrow 2 in the drawing). This demonstrates that, after switching from the high-resistance state to the low-resistance state, the state of the organic bistable element is stable, that is, the organic bistable element is bistable. The difference in current value between the high-resistance state and the low-resistance state at an impressed voltage of −1 V was about $10^3$ A to $10^4$ A.

Next, scanning was carried out so that the voltage was evenly increased from 0 V. As a result, as shown in FIG. 7, in an early stage, the current value gradually increased. When the voltage reached about 1.5 V, however, the absolute value of the current rapidly dereased (as indicated by an arrow 3 in the drawing). This indicates that the organic bistable element was switched from the low-resistance state (ON state) to the high-resistance state (OFF state). This means that previously written information of "1" was erased and the state was returned to one having information of "0."

Further, in the example of the present invention, it could be confirmed that the element switched to the low-resistance state (ON state) maintained the low-resistance state (ON state) even when the voltage was brought to 0 V. This low-resistance state was held for 10 days or longer. This demonstrates that this organic bistable element is nonvolatile and reading can be carried out without loss of the written information of "1."

Figure 8:
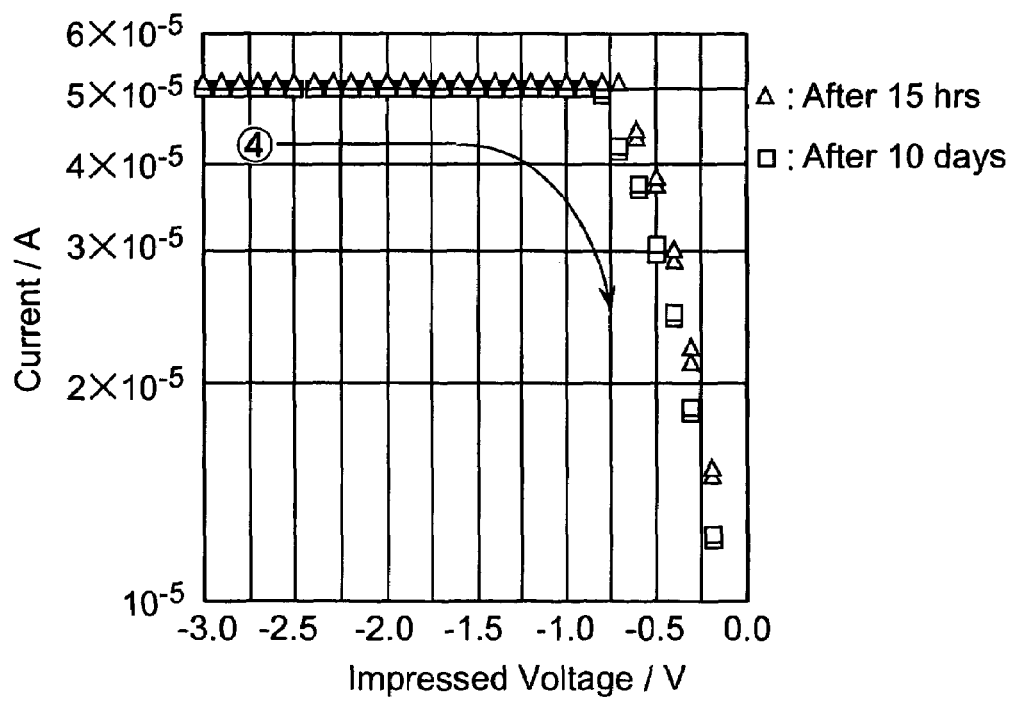
FIG. 8 is a graph showing involatile properties of the organic bistable element according to the present invention.
Figure 9:
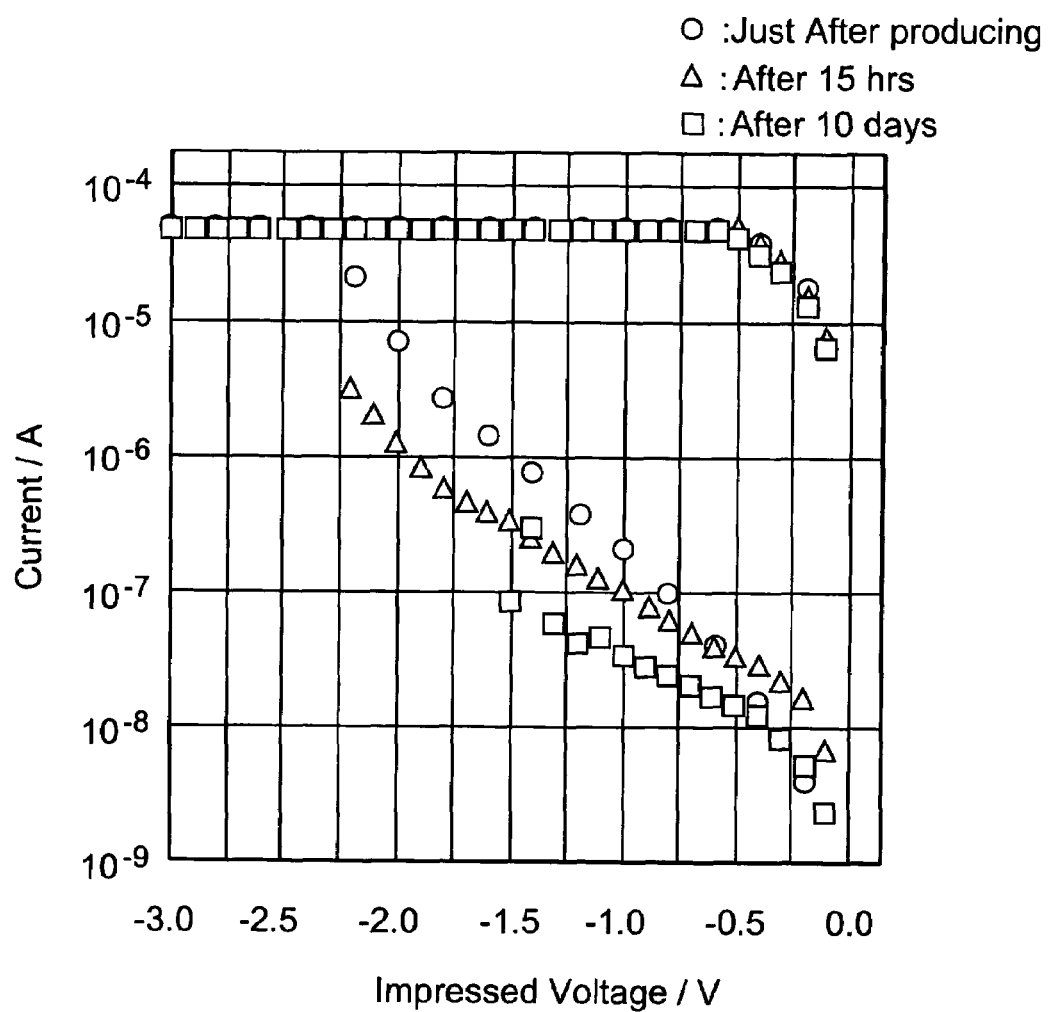
FIG. 9 is a graph showing the drive stability of the organic bistable element according to the present invention.

For the element which maintained the low-resistance state for 10 days and the element which maintained the low-resistance state for 15 hr, scanning was carried out so that the voltage was evenly increased from −3 V to switch the state to the high-resistance state to determine current/voltage characteristics. The results were as shown in FIG. 8 (as indicated by an arrow 4 in the drawing). For the organic bistable element just after the preparation (the element shown in FIGS. 6 and 7) and the organic bistable elements held for a given period of time, scanning from 0 V to −3 V was carried out followed by scanning from −3 V to 0 V to determine current/voltage characteristics. The results are shown in FIG. 9. As can be seen in FIG. 9, the organic bistable element according to the present invention can be driven very stably even after the elapse of time.

In the measurement of current/voltage characteristics, in order to prevent the flow of an excessively large current to the element and to reliably operate the element, a limiter on the negative voltage side was set to ±50 µA.

Figure 10:
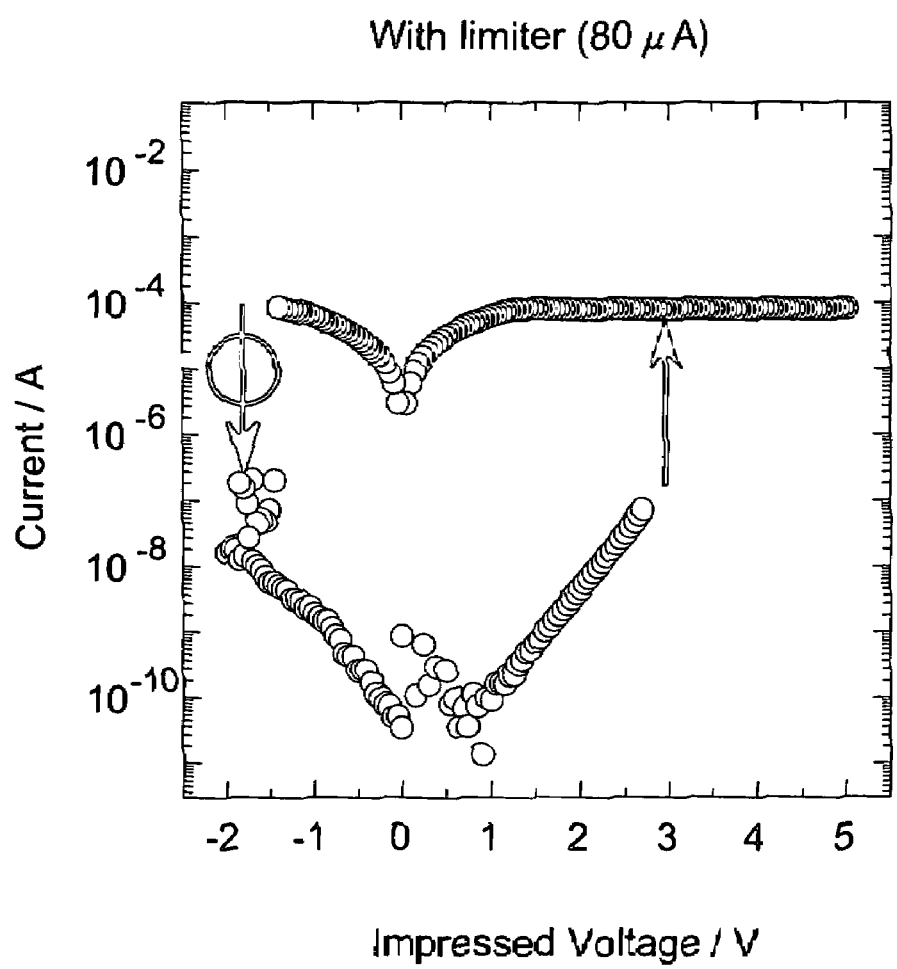
FIG. 10 is a graph showing current/voltage characteristics in the case where an organic bistable element is driven using a limiter.
Figure 11:
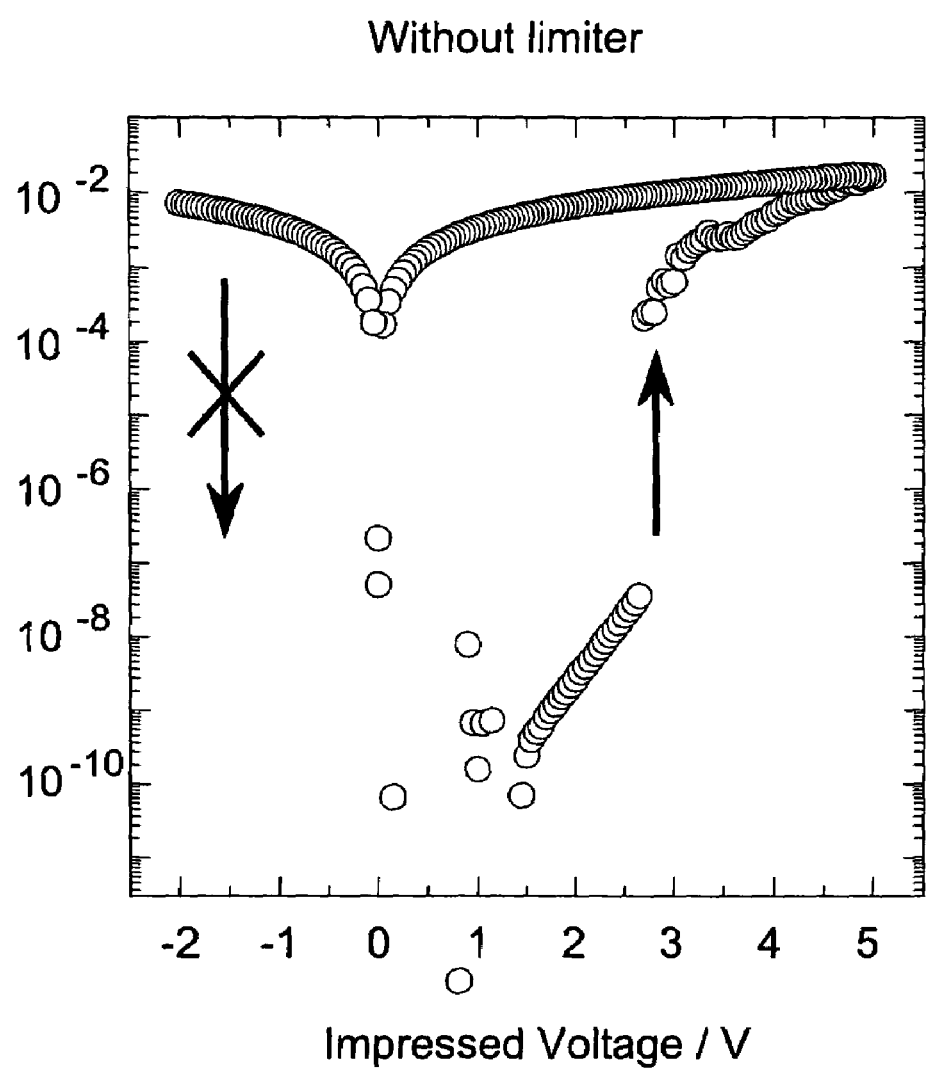
FIG. 11 is a graph showing current/voltage characteristics in the case where an organic bistable element is driven without a limiter.

Next, in driving the organic bistable element of the example of the present invention, the current value was limited to 80 µm with an ammeter (stock number: 237, manufactured by Keithley Instruments, Inc., U.S.A.), and voltage was applied to conduct writing of information. Current/voltage characteristics at that time are shown in FIG. 10. Separately, current/voltage characteristics were measured in the same manner as described just above, except that the current value was not limited. The results are shown in FIG. 11. In the experiment wherein no limiter was provided, switching from the high-resistance state (OFF state) to the low-resistance state (ON state) was possible. However, switching from the low-resistance state (ON state) to the high-resistance state (OFF state) was impossible, resulting in malfunction of the element.

Comparative Example 1

An organic bistable element was prepared in the same manner as in the above Example, except that anthracene was used as the material for the organic thin film. For this organic bistable element, the voltage for switching was high and about 20 V.

Comparative Example 2

An organic bistable element was prepared in the same manner as in the above Example, except that TTF-CA was used as the material for the organic thin film. For this organic bistable element, the voltage for switching was very high and about 300 V to 400 V.

Comparative Example 3

An organic bistable element was prepared in the same manner as in the above Example, except that an organic thin film was formed using 2-amino-4,5-dicyanoimidazole, a highly electrically conductive thin film of aluminum was formed on the organic thin film, and an organic thin film of 2-amino-4,5-dicyanoimidazole was then formed on the highly electrically conductive thin film of aluminum to form a three-layer structure. As with the organic bistable element of the example of the present invention, the comparative organic bistable element thus obtained had a low switching voltage. Due to the complicated structure of the comparative organic bistable element in which three layers were stacked onto top of one another and were interposed between the electrodes, however, the comparative organic bistable element had drawbacks such as the necessity of increasing production process steps and prolonged production time.

What is claimed is:

1. An organic bistable memory device comprising an organic bistable element and a limiter, wherein
    the organic bistable element comprises an organic thin film bistable body having a single layer structure interposed between a first electrode and a second electrode, and
    the limiter limits current, which flows in either a positive bias side or a negative bias side to a given value in writing information into the organic bistable element,
    the organic thin film consisting essentially of an organic compound represented by formula (I):

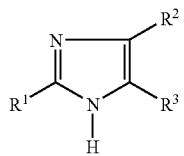

(I)

wherein, in R1, R2, and R3,
one or two of them each independently represent an electron-donating group selected from the group consisting of —H, —NH$_2$—NHR, —NR$_2$, —SR, —X, —CX$_3$, —OH, —OCH$_3$, —OR and —R wherein R represents a straight chain or branched chain alkyl group having 1 to 24 carbon atoms in which one or at least two methylene groups in the alkyl group are optionally substituted by a substituent of —O—, —S—, —CO—, —CHW—, wherein W represents —F—Cl—Br—I—CN or —CF$_3$, —CH═CH—, or —C≡C—, provided that a plurality of said substituents are not adjacent to each other, and X represents —F, —Cl—Br, or —I and
the remaining group or groups of R$^1$, R$^2$, and R$^3$ each independently represent an electron-receiving group selected from the group consisting of —CN, —NO$_2$, —COR, —COOH, —COOR and —SO$_3$H.

2. The organic bistable memory device according to claim 1, further comprising a substrate and either the first electrode or the second electrode is stacked in contact with a top of the substrate.

* * * * *